United States Patent [19]

Baeuerle

[11] Patent Number: 4,859,279
[45] Date of Patent: Aug. 22, 1989

[54] METHOD FOR PRESCRIBED, STRUCTURED DEPOSITION OF MICRO-STRUCTURES WITH LASER LIGHT

[75] Inventor: Dieter Baeuerle, Altenberg, Fed. Rep. of Germany

[73] Assignee: Siemens Aktiengesellschaft, Berlin and Munich, Fed. Rep. of Germany

[21] Appl. No.: 238,523

[22] Filed: Aug. 31, 1988

[30] Foreign Application Priority Data

Sep. 11, 1987 [DE] Fed. Rep. of Germany ....... 3730644

[51] Int. Cl.$^4$ .......................... B44C 1/22; C23F 1/02; C03C 15/00; C03C 25/06
[52] U.S. Cl. ................................... 156/656; 156/643; 156/664; 427/53.1
[58] Field of Search ...................... 427/53.1, 248, 250, 427/255, 256, 271, 284; 156/628, 643, 654, 655, 656, 662, 663, 664; 219/121 LW, 121 LM; 252/79.5

[56] References Cited

U.S. PATENT DOCUMENTS

| 3,585,088 | 6/1971 | Schwuttke et al. | 427/53.1 X |
| 3,801,366 | 4/1974 | Lemelson | 427/53.1 X |
| 4,543,270 | 9/1985 | Oprysko et al. | 427/53.1 |
| 4,626,315 | 12/1986 | Kitamoto et al. | 427/53.1 X |
| 4,748,045 | 5/1988 | Ehrlich et al. | 427/53.1 |

FOREIGN PATENT DOCUMENTS 0182377 5/1986 European Pat. Off. .
2600690 7/1976 Fed. Rep. of Germany .
3442790 6/1986 Fed. Rep. of Germany .
53-39274 11/1978 Japan .

OTHER PUBLICATIONS

"Progress in LPCVD Tungsten for Advanced Microelectronics Applications", Blewer, Solid State Technology/Nov. 1986, pp. 117–126.
"Laser-Direct-Writing Processes: Metal Deposition, Etching, and Applications to Microcircuits", Black et al., 1987, American Vacuum Society, J. Vac. Sci. Technol. B 5 (1), Jan./Feb. 1987, pp. 419–422.
"Photodeposition of Aluminum Oxide and Aluminum Thin Films", Solanki et al., 1983 American Institute of Physics, Appl. Phys. Lett., 43 (5), Sep. 1, 1983, pp. 454–456.
"Localized Laser Chemical Processing of Tungsten Films", Grossman et al., 1987 American Vacuum Society, J. Vac. Sci. Technol. B 5 (4), Jul./Aug. 1987, pp. 843–847.
"Chemical Process with Lasers", Springer Series in Materials Science Bd. 7, pp. 86–106.

Primary Examiner—William A. Powell
Attorney, Agent, or Firm—Hill, Van Santen, Steadman & Simpson

[57] ABSTRACT

An improvement of a method for structured LCVD deposition onto, in particular, non-homogenous material of a substrate member, wherein a metal film of, in particular, tungsten that has a leveling effect with respect to reflectivity and/or lateral heat propagation is provided on a substrate surface before the deposition.

16 Claims, 1 Drawing Sheet

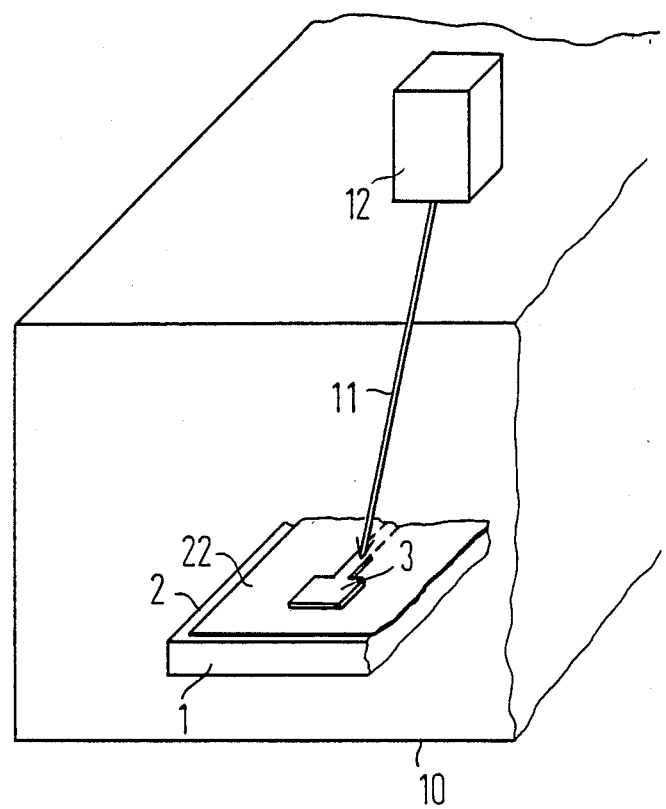

METHOD FOR PRESCRIBED, STRUCTURED DEPOSITION OF MICRO-STRUCTURES WITH LASER LIGHT

BACKGROUND OF THE INVENTION

1. Field of the Invention

The present invention is directed to a method for prescribed, structured deposition of micro-structures with laser light, and in particular to such a method wherein the prescribed substrate surface is previously coated with a thin metal film.

2. Description of the Prior Art

Laser-induced deposition from the adsorbed phase, from the vapor phase and from the liquid phase has been known for some time. In this method, the substrate to be structured is introduced into a reactive atmosphere and a chemical reaction is initiated using laser light. The deposition mechanism can be based on a photo-thermic or photo-chemical activation of the chemical reaction. In photo-thermic deposition, the reaction rates that are achieved are generally a few percentages higher than the reaction rates in photo-chemical deposition. The reaction rates in photo-thermic deposition are generally a few percentages higher because far higher concentrations of the reactive species can be employed in the photo-thermic deposition. For producing micro-structures by direct writing with the laser beam, continuous-wave (cw) ion lasers are particularly suitable. Additionally, on the basis of projection of the laser light, excimer lasers are especially suitable. From the vapor phase, particular interest in the photo-thermic deposition results. This is what is known as the pyrolytic LCVD process.

Chemical deposition from the vapor phase (LCVD method) induced by laser light is also described in "Chemical Processing with Lasers", Springer Series in Materials Science, Volume 1; "Materials Letters", Vol. 2 (1984), pages 263 through 264; EP published application No. 0182377; "Appl. Phys. Letters" 43 (1983) pages 454 through 456.

Japanese Published Application No. 53-39274 discloses that $Al_2O_3$ be volatilized with laser emission in a vacuum from a source, or target, for this material. Further, the $Al_2O_3$ vapor is allowed to deposit on a surface without the influence of the laser emission. This method is used for surface enhancement of optical lenses.

German Published Application No. 26 00 690 discloses how micro-engravings can be produced in arbitrary materials with laser emission. A reflecting surface layer that has recesses at the locations where the erosive effect is to occur is used in combination with erosive material processing on the basis of laser emission.

However, difficulties have since occurred in conjunction with the employment of this laser-induced deposition from the vapor phase. The method can only be used for substrate materials that absorb the incident laser light to an adequate degree. When substrates have adequate absorption and also high reflection, small differences in the surface quality can lead to relatively greater differences with respect to the absorbed laser power. This leads to great modifications or, respectively, tolerances in the lateral dimensions of the micro-structures produced with the laser beam.

Additionally, local differences in the optical or thermic properties of the substrate surface in non-homogenous materials (ceramics, composites, etc.) or in materials that are partially coated, for example silicon wafers that are partially coated with $SiO_2$, can lead to great modifications in the lateral and axial (layer thickness) dimensions.

SUMMARY OF THE INVENTION

It is the object of the present invention to eliminate or to at least minimize the afore-mentioned disadvantages with a new method.

The above object is achieved in accordance with the principles of the present invention in a method wherein the prescribed substrate surface is previously coated with an additional metal film.

In this method of the invention, a metal film is first sputtered or vapor-deposited onto the substrate. The metal film has a thickness of only one nm through ten nm. The thickness is dependent on the metal and dependent on the wavelength of the laser light to be used later. This process step is followed by the known, laser-induced chemical deposition, whereby the micro-structuring of the deposition occurs by direct writing of the laser beam or by employment of a projection method with laser light. The metal film guarantees both a uniform influence (absorption) of the laser emission over a broad spectral region and also guarantees a compensation of different thermal conductivites in non-homogenous substrates or in substrates having differing composition.

After the intended structure has been produced by the laser-induced deposition, those parts of the metal film that are no longer needed are removed by use of a solvent.

Thin, sputtered films of tungsten have proven especially suitable. These thin, sputtered films of tungsten are easily eliminated after the laser-induced structuring using a mixture of aqueous potassium hydroxide and hydrogen peroxide. However, the tungsten can be replaced by any metal that adheres well to the substrate to be used. Molybdenum, chromium, nickel, vanadium and similar metals are particularly suitable for the invention. Agents found, for example, in the "Handbook of Chemistry and Physics", CRS Press, are used for the re-stripping, depending on the substrate material and on the deposited material.

The proposed method is especially well-suited for the manufacture of masks of, for example, Mo, Wo, Pb on a substrate of glass and similar substrates. Also, the proposed method is well suited for the manufacture of structured contacts and interconnects of, for example, Cu, Au, W, Mo. Additionally, selective reinforcement and/or passivation at parts of work pieces, for example the edges of probes, that are particularly stressed in mechanical or chemical terms can be produced via this method. Structured coatings of $SiO_2$, $Al_2O_3$ and the like are also possible using this method.

BRIEF DESCRIPTION OF THE DRAWINGS

The FIGURE is a perspective view of the apparatus for practicing the method of the invention.

DESCRIPTION OF THE PREFERRED EMBODIMENTS

A substrate member 1 on whose upwardly directed surface 2 a structure 3 of deposited material is to be applied is shown in the FIGURE. This structure 3 is, for example, an interconnect having a contact pad of electrically conductive material such as, for example, Au, Cu, Cr, W, Mo, or any similarly electrically conductive material.

A housing 10 in which the substrate member 1 is situated is also shown in the FIGURE. The housing 10 is filled with the reactive gases (reactants). A carrier gas may also be potentially added into the housing with the reactive gases. The laser emission 11 of a laser writing beam focused onto the surface 2 of the substrate member 1 is also shown. This laser emission 11 supplements the method to form the known LCVD method. The controllably deflectable laser emission 11 is beamed onto the substrate surface 2 by a correspondingly equipped laser emission source 12 of a known type. The laser emission should have essentially perpendicular incidence for micro-structure deposition.

The laser-induced growth of the material for the structure 3 occurs due to the laser emission 11. This growth occurs at those locations that are impinged by the controllably deflectable laser beam 11 during the course of deposition procedure. The laser beam 11 can be directly shined on the substrate surface or can be projected onto the surface. The employment of an excimer laser is preferable because of the required energies and the necessity of suppressing diffraction effects. Although, a continuous-wave laser of a standard type is usually adequate for writing with laser emission.

Both when writing with a laser beam as well as in the projection method, laser emission 11 is incident onto the surface portions of the substrate member 1 that absorb the laser emission to different degrees or, respectively, allow it to take effect to different degrees or that have different thermal properties with respect to the arising action of the laser emission.

The surface 2 of the substrate member 1 is coated preferably surface-wide with a thin layer of metal, for example a layer that is one nm through ten nm thick. This metal film 22 can be sputtered on, vapor-deposited or can be applied in some other available way. The application of the metal film 22 can be undertaken outside of the housing 10. The employment of W, Mo, Cr, Ni, in the range of the thickness values recited above, has proven particularly advantageous. These metals can also serve as an adhesion promoter. However, the critical significance of such a coating is that the reflectivity of the substrate surface is level. This leveling compensates thermal inhomogeneities within the substrate surface. Location-independent, uniform deposition given area-associated, uniform laser irradiation is obtained with the assistance of this invention.

When the metal film 22 is no longer needed for further employment of the substrate 1 provided with the micro-structure 3, the film is removed. If for example, the metal film is tungsten it can be easily removed with a mixture of aqueous potassium hydroxide and hydrogen peroxide.

As a result of the invention, an entire mask with such a micro-structure 3 can be manufactured using, for example, Mo, W, Pb structuring on, for example, glass or a similar substrate. Such heavy metals are particularly suitable for x-ray masks.

As is apparent from the foregoing specification, the invention is susceptible of being embodied with various alterations and modifications which may differ particularly from those that have been described in the preceeding specification and description. It should be understood that I wish to embody, hereon all such modifications as reasonable and properly come with the scope of my contribution to the art.

I claim as my invention:

1. A method for generating a structured surface on a substrate comprising the steps of:

covering at least a portion of said surface of said substrate with a metal film;
   structuring said surface of said substrate at selected locations by laser-controlled vapor deposition with said film in place; and
   removing portions of said film unaffected by said vapor deposition.

2. A method as claimed in claim 1, wherein the step of covering at least a portion of said surface of said substrate with a metal film is further defined by covering at least a portion of said surface of said substrate with tungsten.

3. A method as claimed in claim 1, wherein the step of covering at least a portion of said surface of said substrate with a metal film is further defined by covering at least a portion of said surface of said substrate with a material selected from the group consisting of molybdenum, chromium and nickel.

4. A method as claimed in claim 1, wherein the step of covering at least a portion of said surface of said substrate with a metal film is further defined by covering at least a portion of said surface of said substrate with a metal film having a thickness from one nm through ten nm.

5. A method as claimed in claim 2, wherein the step of removing portions of said film unaffected by said vapor deposition is further defined by removing portions of said film unaffected by said vapor deposition with a mixture of acqueous potassium hydroxide and hydrogen peroxide.

6. A method as claimed in claim 1, wherein said structure of the deposition is limited by controllable deflection of the laser emission employed in a writing method.

7. A method according to claim , further comprising:
   transferring said structure onto said substrate surface using the principle of projection exposure, being transferred with laser emission from a projection original.

8. A method as claimed in claim 1, further comprising:
   depositing a contact metal of a material selected from the group consisting of Cu, W, Mo and Au.

9. A method as claimed in claim 1, wherein the step of structuring said surface of said substrate at selected locations, by laser-controlled vapor deposition with said film in place is further defined by depositing $SiO_2$ and $Al_2O_3$ at selected locations.

10. A method as claimed in claim 1, further comprising:
    selecting said substrate member to be a non-homogeneous material.

11. A method as claimed in claim 10, further comprising:
    selecting said substrate member to be ceramic.

12. A method as claimed in claim 10, further comprising:
    selecting said substrate member to be a composite.

13. A method as claimed in claim 1, further comprising:
    selecting said substrate member to be a silicon wafer.

14. A method as claimed in claim 10, further comprising:
    selecting said substrate member to be a silicon wafer.

15. A method as claimed in claim 1, further comprising:
    using said method for the manufacture of a mask.

16. A method as claimed in claim 1, further comprising:
    using said method for the manufacture of electrical interconnects.

* * * * *